United States Patent [19]

Wang et al.

[11] Patent Number: 5,155,571
[45] Date of Patent: Oct. 13, 1992

[54] COMPLEMENTARY FIELD EFFECT TRANSISTORS HAVING STRAINED SUPERLATTICE STRUCTURE

[75] Inventors: Kang L. Wang, Santa Monica; Jason C. Woo, Encino, both of Calif.

[73] Assignee: The Regents of the University of California, Oakland, Calif.

[21] Appl. No.: 563,038

[22] Filed: Aug. 6, 1990

[51] Int. Cl.$^5$ .................. H01L 27/02; H01L 29/161; H01L 27/12
[52] U.S. Cl. .................... 357/42; 357/61; 357/16; 357/4
[58] Field of Search ............. 357/42, 23.2, 16, 4, 357/22, 23.7, 59, 61

[56] References Cited

U.S. PATENT DOCUMENTS

| | | | |
|---|---|---|---|
| 4,556,895 | 12/1985 | Ohata | 357/23.2 |
| 4,661,829 | 4/1987 | Bean et al. | 357/23.1 |
| 4,697,197 | 9/1987 | Dresner | 357/4 |
| 4,710,788 | 12/1987 | Dambkes et al. | 357/16 |
| 4,879,256 | 11/1989 | Bean et al. | 357/4 |
| 4,994,866 | 2/1991 | Awano | 357/42 |
| 5,001,536 | 3/1991 | Fukuzawa et al. | 357/22 |
| 5,019,882 | 5/1991 | Solomon et al. | 357/23.8 |

FOREIGN PATENT DOCUMENTS

| | | | |
|---|---|---|---|
| 58-61675 | 4/1983 | Japan | 357/42 |
| 62-54459 | 3/1987 | Japan | 357/42 |
| 63-122177 | 5/1988 | Japan | 357/42 |

OTHER PUBLICATIONS

Applied Physics Letters, vol. 53, #3, pp. 204–206 by Rhee et al., Jul. 18, 1988.
Thin Solid Films, 183, pp. 57–63 by Arbet et al., 1989.
IBM Technical Disclosure Bulletin, vol. 28, #2, p. 500, Jul. 1985 "Germanium P-Channel MOSFET".

*Primary Examiner*—Mark V. Prenty
*Attorney, Agent, or Firm*—Townsend and Townsend

[57] ABSTRACT

The carrier mobilities for both electrons and holes in complementary field effect transistor structures such as CMOS and CMOD devices are increased by using strained $Ge_xSi_{1-x}/Si$ layers for the carrier conduction channels. The carrier mobilities for the holes and electrons can be of substantially the same magnitude which is advantageous for complementary logic applications. The complementary FET structures can be advantageously employed with bipolar devices in integrated circuits.

3 Claims, 3 Drawing Sheets

COMPLEMENTARY FIELD EFFECT TRANSISTORS HAVING STRAINED SUPERLATTICE STRUCTURE

BACKGROUND OF THE INVENTION

This invention relates generally to complementary field effect transistors (CMOS) and complementary modulation doped field effect transistors (CMOD), and more particularly the invention relates to such transistors having structures which enhance and equalize current carrier mobilities with a built-in SiGe quantum well.

There is presently much interest in the use of $Ge_xSi_{l-x}$ alloy strained layers in microelectronic applications. See for example Bean et al. U.S. Pat. No. 4,879,256 having a strained superlattice semiconducting system which can be used to produce order-disorder phase transitions in semiconductor alloys; Bean et al. U.S. Pat. No. 4,661,829 having germanium-silicon alloys with strained superlattice structures; and Dresner U.S. Pat. No. 4,697,197 having alternate interleaved layers of materials in a superlattice channel region. The compatibility of GeSi alloys with silicon based technology provides the convenient implementation of any development and advancement. Recently, heterojunction bipolar transistors using $Ge_xSi_{l-x}$/Si strained layers have demonstrated potential applications in high speed computers, communication and signal processing. See Plummer and Taft U.S. Pat. No. 4,825,269. Cut-off frequency, an indicator for the performance, above 75 GHz has been recently reported. In addition to the intrinsic speed and frequency advantages, the presence of a proper strain offers yet higher carrier mobility and can further enhance the device and circuit performance. Moreover, the mobility of the layers can be increased if the dopants are placed in the barrier region of the heterojunction.

In $Al_xGa_{l-x}As$/GaAs heterojunction structures, such art of increasing mobility has been reported and implemented in so called high electron mobility transistors (HEMT) or modulation doped field effect transistors (MODFET). Similarly, $Ge_xSi_{l-x}$/Si MODFETS have been demonstrated.

Recently there has been a thrust in integrating conventional homojunction bipolar and CMOS devices on the same semiconductor chip since the overall performance benefits can be derived from both of the devices. This silicon technology is known as BiCMOS. The drawback of the conventional CMOS is the large difference of the electron and hole mobilities. For MOS, the channel electron mobility is about 700 $cm^2/V_s$ and the channel hole mobility is substantially below the electron mobility.

SUMMARY OF THE INVENTION

Accordingly, an object of the present invention is a logic device using complementary FETs having increased operating speed.

Another object of the invention is to have a built-in SiGe quantum well.

Another object of the invention is a complementary field effect transistor in which carrier mobilities are enhanced.

Still another object of the invention is complementary metal oxide semiconductor transistors (CMOS) and complementary modulation doped field effect transistors (CMOD) having equalized carrier mobilities.

Yet another object of the invention is improved BiCMOS integrated circuits.

Another object of the invention is to have a cap layer on top of GeSi to improve the oxidation process in reducing the interface state density and in stabilizing the underlying GeSi layer.

A feature of the invention is the use of a strained layer quantum well or superlattice structure for enhancing carrier mobility.

Briefly, in accordance with one embodiment of the invention a silicon CMOS transistor utilizes n-type strained $Ge_x Si_{l-x}$ for the p-channel transistor whereby the mobility of the holes is increased to match the mobility of the electrons in the n-channel transistor.

In another embodiment of the invention, a complementary modulation doped field effect transistor uses strained Si and GeSi alloy layers and a relaxed $Ge_xSi_{l-x}$ layer to enhance the electron mobility in the n-channel transistor while a strained Si or a strained $Ge_xSi_{l-x}$ alloy layer is used to enhance the hole mobility in the p-channel transistor.

The CMOS and CMOD devices can be incorporated along with a heterojunction bipolar transistor in an improved BiCMOS or BiCMOD microelectronic circuit.

The invention and objects and features thereof will be more readily apparent from the following detailed description and appended claims when taken with the drawing.

DETAILED DESCRIPTION OF ILLUSTRATIVE EMBODIMENTS

Figure 1:
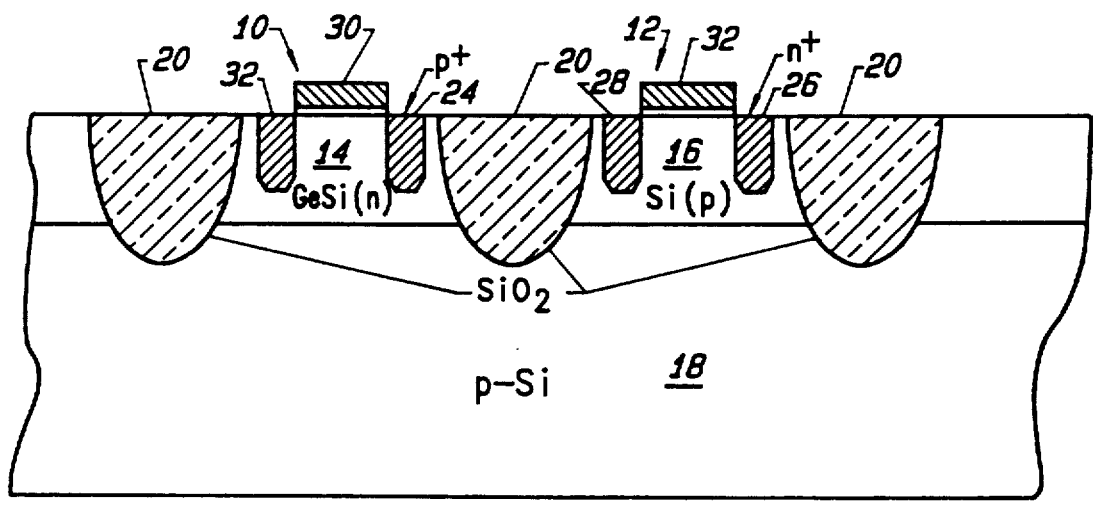
FIG. 1 is a section view of a CMOS transistor structure in accordance with one embodiment of the invention.

Referring now to the drawing, FIG. 1 is a section view of a CMOS transistor structure in accordance with one embodiment of the invention in which the hole mobility of the p-channel transistor is increased to a value comparable to the electron mobility of the n-channel transistor. In this embodiment a p-channel device region 10 and an n-channel device region 12 are respectively formed in an n-doped GeSi layer 14 and a p-doped Si layer 16 formed on the surface of a p-doped silicon substrate 18. Alternatively, an insulative substrate such as sapphire can be used. The transistor region 10 and the transistor region 12 are electrically isolated from each other by means of oxide isolation 20 which extends from the surface of the layers 14, 16 to the p-doped silicon substrate 18. Oxide isolation is a known technique in which the surface region is etched and then oxidized to grow the oxide isolation regions. P-doped source and drain regions 22, 24 are formed in the GeSi layer 14, and n+ doped source and drain regions 26, 28 are formed in the Si layer 16 with gates 30 and 32 formed over the channel regions between the source and drain regions.

Figure 2:
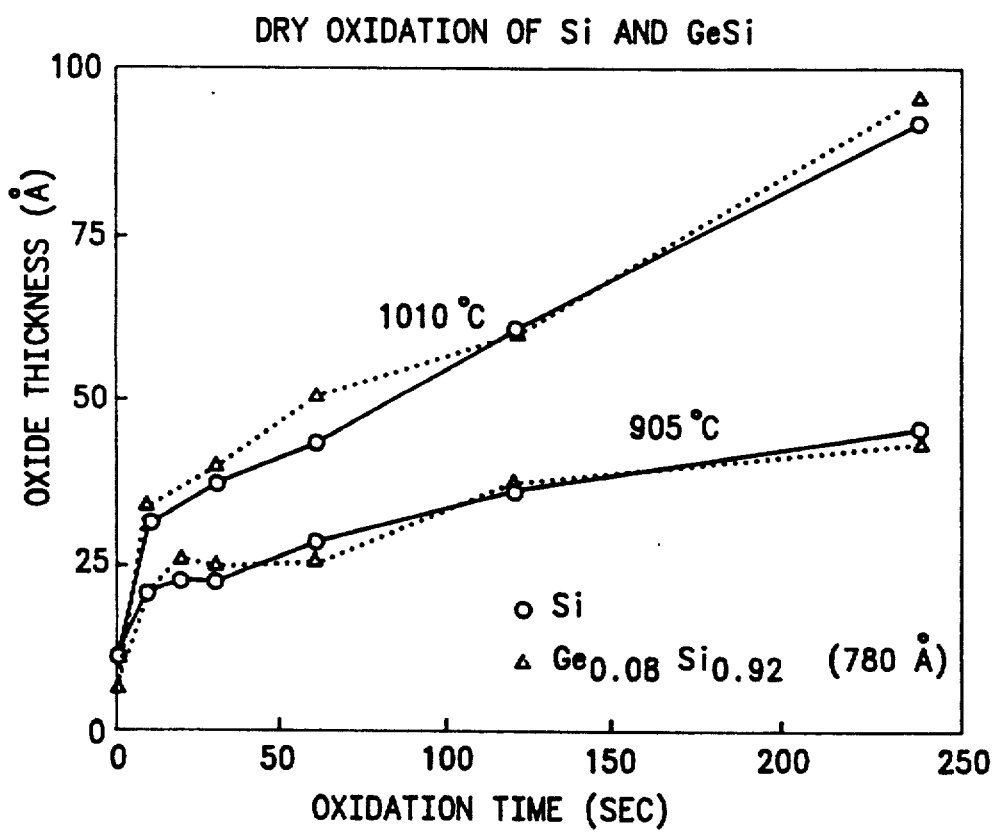
FIGS. 2 and 3 illustrate oxidation properties of strained $Ge_x Si_{l-x}$ alloys.
Figure 3:
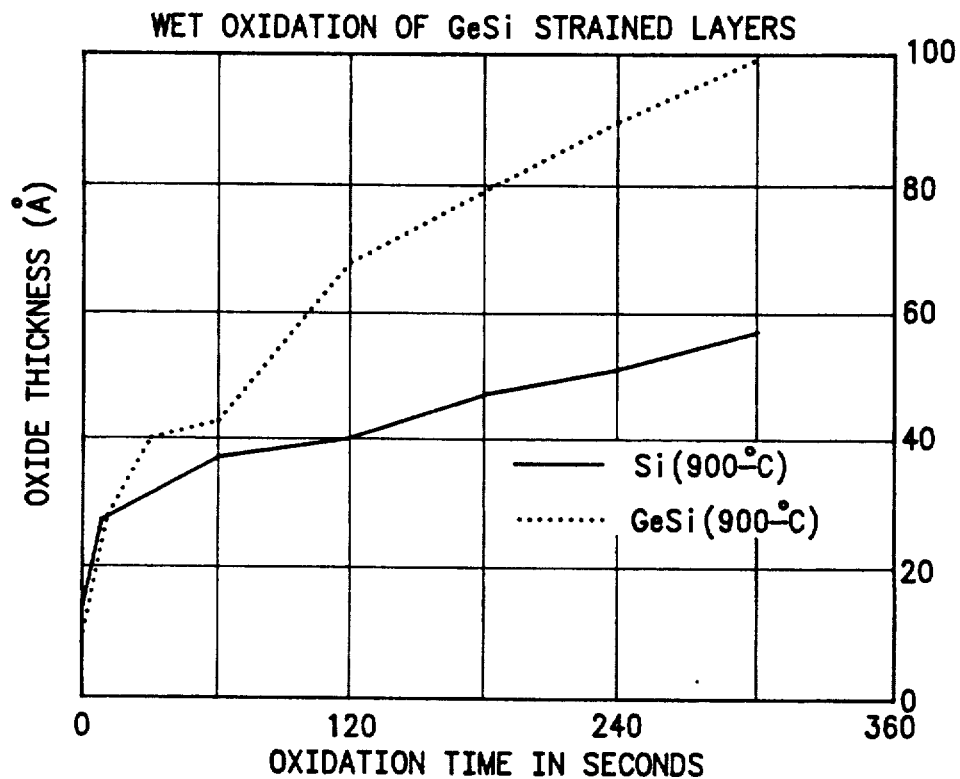

The n-channel device can be built on p-type silicon as shown or on $Ge_xSi_{1-x}$ alloy similar to layer 14 except for changing n-type to p-type doping, and the p-channel device is built on an n-type strained $Ge_xSi_{1-x}$ layer whose hole mobility is increased due to the presence of the strain. The theoretical value of the hole mobility is estimated to be as high as 2,300 cm$^2$/V$_s$, comparable to the electron mobility of $Ge_xSi_{1-x}$ layers. For realization of the MOS transistor, high quality gate oxide and a low interface state density must be obtained. The oxidation of the $Ge_xSi_{1-x}$ layers using rapid thermal processing provides the requisite high quality oxide. FIGS. 2 and 3 are graphs illustrating the oxidation of Si and GeSi alloy in a dry oxidation process (FIG. 2) and in a wet oxidation process (FIG. 3).

Another of achieving high quality oxide and a low interface state density is to provide a thin Si layer on top of the SiGe layer. The oxidation then proceeds with the thin Si, resulting in pure $SiO_2$.

Figure 4A:
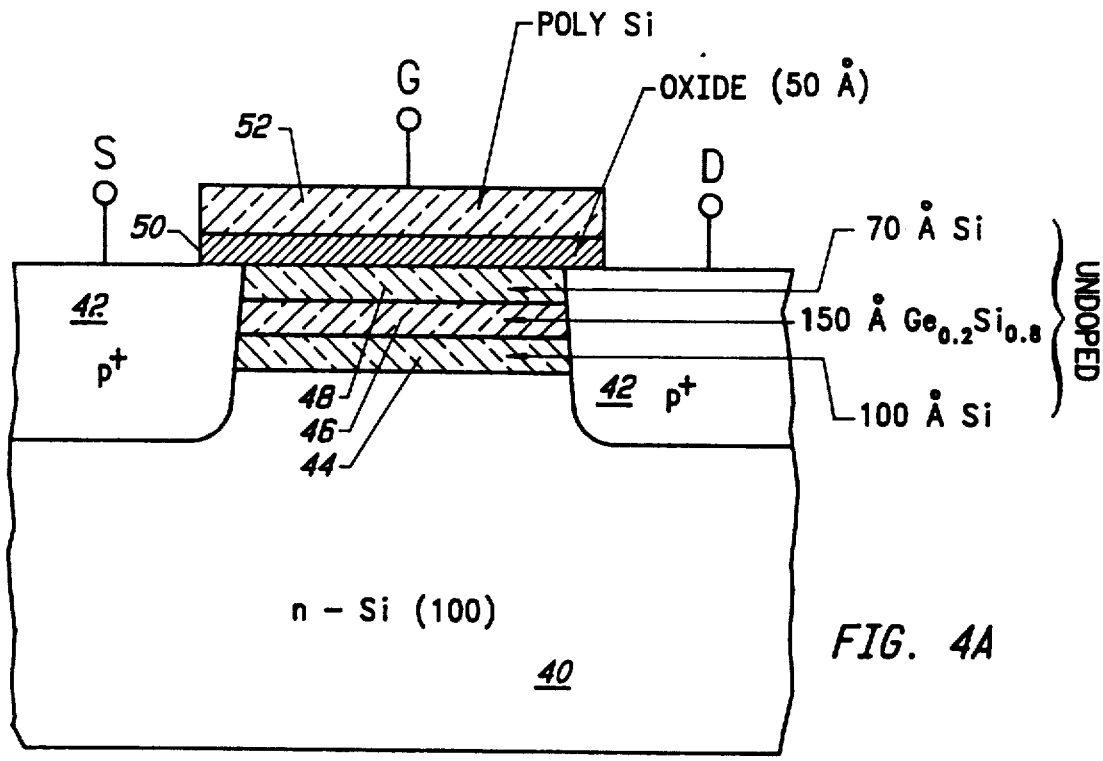
FIG. 4A is a section view of a quantum well p-channel MOSFET in accordance with another embodiment of the invention.

FIG. 4A shows a schematic figure of a quantum well p-channel MOSFET incorporating the modulation doping concept and a cap layer, which is used to improve the stability of the underlying SiGe layer. The layers shown are undoped and the substrate is n-type. The 100 Å Si layer is used as a spacer layer to reduce the columbic scattering. The cap layer has been partly oxidized to produce the 50–150 Å (50 Å shown) gate oxide. The thickness of the remaining layer can be optimized for the best device performance.

In fabricating the device the starting material grown by molecular beam epitaxy on a n-type 100 Si substrate 40 consists of a 5000 Å Si buffer layer 42 (doped to $5\times10^{16}$/cm$^3$), a 100 Å undoped Si setback layer 44, a 150 Å of $Ge_{0.2}Si_{0.8}$ layer 46, and a 100 Å undoped Si cap layer 48. A gate oxide 50 separates a polysilicon gate 52 from the quantum well.

The device process steps are similar to that of a Si MOSFET process. The self-aligned PMOS process has a 7000 Å field oxide by LTO, and a 50 Å gate oxide thermally grown by rapid thermal wet oxidation (870° C. for 5 minutes). The drain/source is formed by B+ implant ($2\times10^{1.5}$/cm$^2$ at 30 KeV). The post implant anneal is performed by rapid thermal annealing at 770° C. for 5 minutes. Similarly processed bulk Si transistors are used to study the device advantages of the GeSi MOSFET's.

Figure 4B:
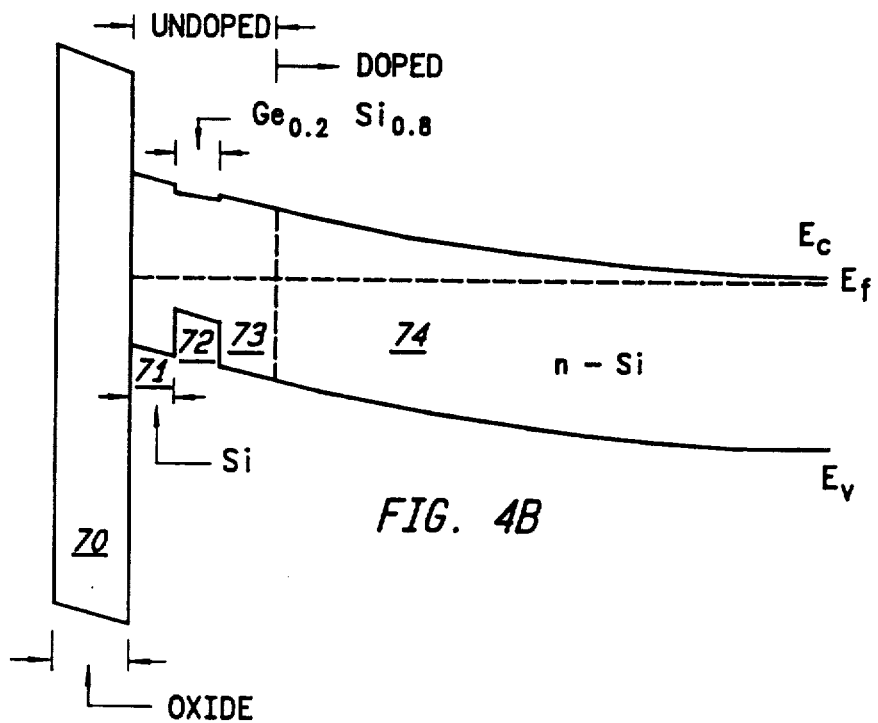
FIG. 4B illustrates the band diagram of the device of FIG. 4A.

FIG. 4B illustrates the band diagram of the device shown in FIG. 4A, showing the conduction channel in the quantum well. Since the Fermi-level is closer to the valence band of the quantum well 72, almost all of the holes will be confined there. As these holes in the quantum well are remote from the interface between the oxide and the silicon interface, interface scattering is greatly reduced compared to conventional surface channel MOSFETs. In addition, as the silicon layers 44 and 48 are undoped, the hole in the undoped strained quantum well 72 will suffer very little impurity scattering. These effects coupled with the fact that the strained layer mobility enhancement will give high current drive for this device. Silicon layer 74 is doped n-type as in conventional PMOS devices. The same principles of modulation doping and capping may be applied for n-channel devices.

Figure 5:
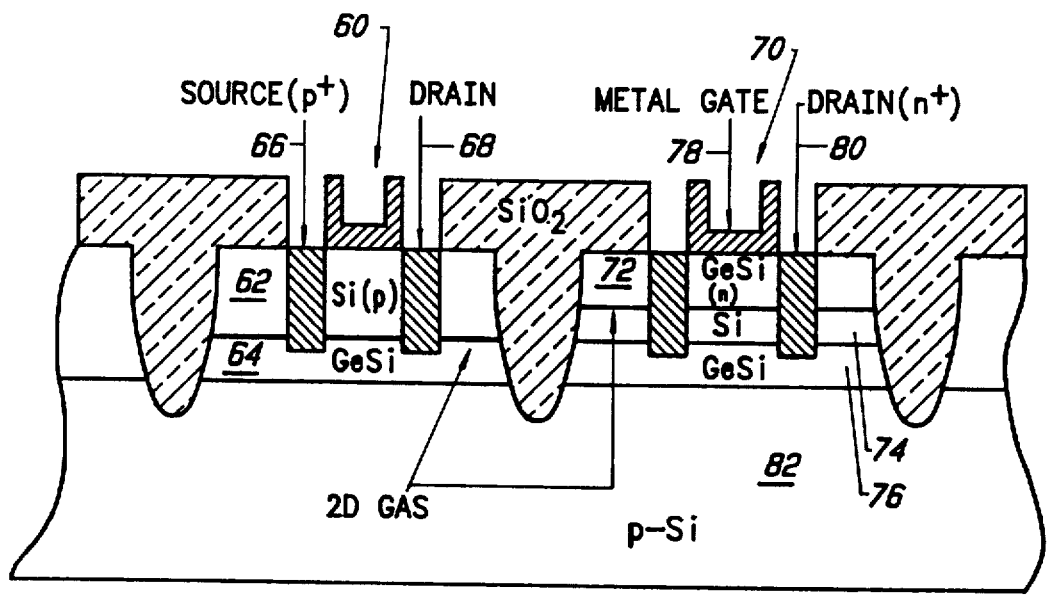
FIG. 5 is a section view of a CMOD transistor structure in accordance with another embodiment of the invention.

FIG. 5 is a section view of another embodiment of the invention in which GeSi alloy layers are employed in a MODFET. In this embodiment the p-channel device 60 is formed in an oxide isolated device region including a p-doped silicon layer 62 and a GeSi alloy layer 64. The p+ doped source 66 and drain 68 extend from the surface of the silicon layer 62 to the GeSi layer 64.

The n-channel device 70 is formed in another oxide isolated region and includes an n-doped GeSi layer 72, an Si layer 74, and a GeSi layer 76. The n+ doped source 78 and drain 80 extend from the surface of the GeSi layer 72 to the GeSi layer 76. The two structures are formed on a p-doped silicon substrate 82. A metal gate 69 is formed on the surface of the Si layer 62 between the source 66 and drain 68, and another metal gate 81 is formed on the surface of GeSi layer 72 between the source 78 and drain 80 of the n-channel transistor 70.

In this embodiment the Si layer 74 and GeSi layer 72 of the n-channel device are strained, and the GeSi layer 76 in the bottom is relaxed of the strain. The strain relaxation may be accomplished by the growth of a thick layer exceeding the critical thickness, or by means of high temperature heat treatment. Ion implantation can also be used to provide the damage to relax the strain in the film. Ion implantation is perhaps preferred as it is a standard technique in microelectronic fabrication. The desired pattern in the selective areas can be achieved by a photolithographic masking process followed by ion implantation.

In the p-channel MODFET 60, the two dimensional hole gas which is formed by the transfer of holes from the p-doped Si layer 62 is confined in the area shown in the heavy line as indicated. Contrary to the n-channel transistor 70, the $Ge_xSi_{1-x}$ layer 64 is strained. The presence of the strain enhances the hole mobility, making a better match of mobilities between both n-channel and p-channel devices. The isolation of the two devices is again done by trench etch and oxide deposition which is a known technique in the semiconductor field. A low thermal budget is a key to the successful implementation of the technology to prevent undesired relaxation of the strained layers.

As discussed previously, similar devices as illustrated in FIG. 4A and 4B and complementary n-channel devices may be used to replace the devices shown in FIG. 5 for CMOS applications.

There has been described several embodiments of complementary field effect transistor structures in which the hole mobility has been increased relative to the electron hole mobility. The structures may be incorporated along with a heterojunction bipolar transistor to form BiCMOS or BiCMOD integrated circuits.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

We claim:

1. A complementary field effect transistor device comprising
    a substrate and a plurality of epitaxial semiconductor layers grown thereon,
    an n-channel field effect transistor formed in a first epitaxial layer having n-type source and drain regions and a channel region, and
    a p-channel field effect transistor formed in a second epitaxial layer and having p-type source and drain regions and a channel region, said second epitaxial layer including a strained germanium-silicon alloy layer in the channel region.

said p-channel field effect transistor being formed in a first isolated region of said second epitaxial layer and having a channel region composed of a lower layer of strained germanium-silicon alloy and an unstrained silicon layer formed on said strained germanium-silicon alloy, and said n-channel field effect transistor being formed in a second isolated region of said first epitaxial layer and having a channel region including an unstrained germanium-silicon alloy layer, a silicon layer formed on said unstrained germanium-silicon layer, and a strained germanium-silicon alloy layer formed on said silicon layer, and whereby the carrier mobilities in the channel regions of the n-channel and p-channel field effect transistors are comparable.

2. A complementary modulation doped field effect transistor device comprising a substrate and a plurality of semiconductor layers grown thereon, a p-channel field effect transistor formed in a first isolated region of a first semiconductor layer and having a channel composed of a lower layer of strained germanium-silicon alloy and an unstrained silicon layer formed on said strained germanium-silicon alloy, and an n-channel field effect transistor formed in a second isolated region of a second semiconductor layer and having a channel including an unstrained germanium-silicon alloy layer, a silicon layer formed on said unstrained germanium-silicon layer, and a strained germanium-silicon alloy layer formed on said silicon layer, whereby the carrier mobilities in the channels of the n-channel and p-channel field effect transistors are comparable.

3. The complementary modulation doped field effect transistor device as defined by claim 2 wherein said substrate comprises p-doped silicon.

* * * * *

UNITED STATES PATENT AND TRADEMARK OFFICE
CERTIFICATE OF CORRECTION

PATENT NO.  : 5,155,571
DATED       : October 13, 1992
INVENTOR(S) : KANG L. WANG, JASON C. WOO It is certified that error appears in the above-identified patent and that said Letters Patent is hereby corrected as shown below:

IN THE DRAWINGS:

Figure 1, p-doped source region 22 is mislabelled as --32--;

Figure 5, the metal gate 69 on the surface of layer 62 is not labelled;

the metal gate 81 on the surface of layer 72 is not labelled;

the n+ source 78 in layers 72, 74, 76 is not labelled.

Column 1, line 54, change "$V_s$" to --Vs--.
Column 3, line 27 and 28, change "columbic" to --Coulombic--.

Signed and Sealed this

Eighth Day of February, 1994

Attest:

BRUCE LEHMAN

Attesting Officer          Commissioner of Patents and Trademarks